(12) United States Patent
Lin et al.

(10) Patent No.: US 8,222,962 B2
(45) Date of Patent: Jul. 17, 2012

(54) HIGH-RESOLUTION DIGITALLY CONTROLLED OSCILLATOR AND METHOD THEREOF

(75) Inventors: Chia-Liang Lin, Fremont, CA (US); Chi-Kung Kuan, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 208 days.

(21) Appl. No.: 12/115,081

(22) Filed: May 5, 2008

(65) Prior Publication Data

US 2009/0085681 A1    Apr. 2, 2009

Related U.S. Application Data

(60) Provisional application No. 60/975,817, filed on Sep. 28, 2007.

(51) Int. Cl.
*H03B 5/12*    (2006.01)
*H03C 3/09*    (2006.01)

(52) U.S. Cl. ............ 331/36 C; 331/34; 331/117 R; 331/117 FE; 331/167; 331/177 R

(58) Field of Classification Search ............ 331/34, 331/36 C, 57, 111, 117 R, 117 FE, 167, 177 R
See application file for complete search history.

(56) References Cited

U.S. PATENT DOCUMENTS

| | | | | |
|---|---|---|---|---|
| 6,621,364 B2 * | 9/2003 | Grewing et al. | ......... | 331/177 V |
| 6,650,194 B1 * | 11/2003 | Kertis et al. | ............ | 331/117 R |
| 6,653,908 B1 * | 11/2003 | Jones | ............... | 331/183 |
| 6,658,748 B1 | 12/2003 | Leipold et al. | | |
| 6,734,741 B2 | 5/2004 | Staszewski et al. | | |
| 6,791,422 B2 | 9/2004 | Staszewski et al. | | |
| 6,833,769 B2 * | 12/2004 | Seppinen et al. | ......... | 331/177 V |
| 7,053,727 B2 * | 5/2006 | Nilsson | ............ | 332/127 |
| 7,212,073 B2 * | 5/2007 | Youssoufian et al. | ....... | 331/36 C |
| 2005/0116757 A1 * | 6/2005 | Kunanayagam et al. | ..... | 327/266 |
| 2006/0192623 A1 * | 8/2006 | Baig et al. | ............ | 331/57 |
| 2007/0222526 A1 * | 9/2007 | Mayer et al. | ............ | 331/34 |
| 2008/0012654 A1 * | 1/2008 | Han et al. | ............ | 331/167 |

OTHER PUBLICATIONS

Maxim, "A Multi-Rate 9.953-12.5-GHz 0.2-μm SiGe BiCMOS LC Oscillator using a resistor-tuned varactor and a supply pushing cancellation circuit," IEEE Journal of Solid-State Circuits, vol. 41, Issue 4, pp. 918-934, Apr. 2006.

Office Action issued in connection with Taiwanese Patent Application No. 097137336, issued on Oct. 27, 2011.

Office Action issued in connection with Chinese Patent Application No. 2008-10161902.8, mailed n Jul. 25, 2011.

(Continued)

*Primary Examiner* — Arnold Kinkead
*Assistant Examiner* — Richard Tan
(74) *Attorney, Agent, or Firm* — Knobbe Martens Olson and Bear, LLP

(57) ABSTRACT

A digitally controlled oscillator provides high resolution in frequency tuning by using a digitally controlled capacitive network that includes a tunable capacitive circuit, a first capacitor and a second capacitor. The tunable capacitive circuit generates a variable capacitance according to a digital control word. The first capacitor is coupled in an electrically parallel configuration with the tunable capacitive circuit. The second capacitor is coupled in an electrically serial configuration with a combination of the first capacitor and the tunable capacitive circuit. The first capacitor and the second capacitor are sized such that an effective capacitance of the digitally controlled capacitor network has a step size that is a fraction of a step size of the variable capacitance in response to an incremental change in the digital control word.

6 Claims, 5 Drawing Sheets

OTHER PUBLICATIONS

Pletcher et al., "A 100µW, 1.9GHz oscillator with fully digital frequency tuning," Solid-State Circuits Conference, 2005. ESSCIRC 2005. Proceedings of the 31$^{st}$ European, pp. 387-390, Sep. 12-16 2005.

Wang et al., "A 3.8GHz Fully Integrated Digitally-Controlled LC Oscillator for PHS Transceiver," International Conference on Communications, Circuits and Systems Proceedings, 2006, vol. 4, pp. 2263-2267, Jun. 2006.

Pittorino et al.. "A UMTS-compliant fully digitally controlled oscillator with 100Mhz fine-tuning range in 0.13/spl mu/m CMOS," Solid-State Circuits Conference, 2006. ISSCC 2006. Digest of Technical Papers. IEEE International, pp. 770-779, Feb. 6-9, 2006.

Pittorino et al., "A First Dual-Mode RF Fully Digitally Controlled Oscillator in 0.13µm CMOS," Microwave Conference, 2006. 36$^{th}$ European, pp. 79-82, Sep. 10-15, 2006.

* cited by examiner

HIGH-RESOLUTION DIGITALLY CONTROLLED OSCILLATOR AND METHOD THEREOF

The present application claims priority benefits under 35 U.S.C. §119(e) from U.S. Provisional Application No. 60/975,817, filed on Sep. 28, 2007 and entitled "High-Resolution Digitally Controlled Oscillator and Method Thereof," which is hereby incorporated herein in its entirety by reference.

BACKGROUND OF THE INVENTION

1. Field of the Invention

The present invention relates to a digitally controlled oscillator and in particular to a digitally controlled oscillator having a high resolution in frequency tuning.

2. Description of the Related Art

A digitally controlled oscillator (DCO) is a circuit used for generating a periodic signal of a frequency controlled by a digital control word. FIG. 1A depicts a prior art DCO 100A comprising a pair of cross-coupled N-channel metal oxide semiconductor (NMOS) transistors M1 and M2 configured as a positive feedback loop between a first output node VO1 and a second output node VO2, a pair of inductors L1 and L2 configured as a load to the transistors M1 and M2, and a varactor array 110 shunt between outputs (or drain terminals) of the transistors M1 and M2 to provide a tunable capacitance. In FIG. 1A, VDD denotes a first fixed-potential circuit node and VSS denotes a second fixed-potential circuit node.

The varactor array 110 comprises N varactor pairs (e.g., a first pair {101, 102}, a second pair {111, 112}, a third pair {121, 122}, and so on), wherein N is an integer. A varactor is a special type of capacitor with a capacitance determined by a voltage applied to it. FIG. 1B depicts a typical transfer characteristic for capacitance as a function of applied voltage for a varactor. As the applied voltage increases, the capacitance of the varactor approaches a minimum value $C_{min}$. As the applied voltage decreases, the capacitance of the varactor approaches a maximum value $C_{max}$. Thus, application of a sufficiently high voltage or a sufficiently low voltage can be used to attain the minimum capacitance value $C_{min}$ or the maximum capacitance value $C_{max}$ of the varactor.

In FIG. 1A, the varactor array 110 receives an N-bit control word D[N−1:0] comprising N control bits. Each control bit is either logically 1 (i.e., a sufficiently high voltage) or logically 0 (i.e., a sufficiently low voltage) and is used to control one respective varactor pair. Each varactor pair comprises a first varactor and a second varactor. The first varactor is connected to the first output node VO1 on one end and to a control bit on the other end. The second varactor is connected to the second output node VO2 on one end and to the same control bit on the other end. For instance, the first varactor pair {101, 102} comprises a first varactor 101 and a second varactor 102; the first varactor 101 is connected to the first output node VO1 on one end and to the control bit D[0] on the other end; and the second varactor 102 is connected to the second output node VO2 on one end and to the same control bit D[0] on the other end. In this manner, a total effective capacitance of the varactor array 110 is tunable between $N \cdot C_{min}/2$ and $N \cdot C_{max}/2$, inclusively, with a step size of $(C_{max}-C_{min})/2$. Here, the divide by two expression (/2) accounts for the fact that the two varactors in each varactor pair are connected in series and therefore the total capacitance, as seen by the differential signal defined by the two output nodes VO1 and VO2, is halved.

The varactor array 110 and the two inductors L1 and L2 form a resonator circuit with a resonant frequency that roughly determines an oscillating frequency of the DCO 100A. The pair of cross-coupled NMOS transistors M1 and M2 provides a gain to sustain the oscillation, but has little influence on the oscillating frequency. Therefore, the oscillating frequency of the DCO 100A is tunable between approximately $1/2\pi\sqrt{L \cdot N \cdot C_{max}}$ and $1/2\pi\sqrt{L \cdot N \cdot C_{min}}$, wherein L denotes an inductance value for the inductors L1 and L2.

The DCO 100A has a frequency tuning resolution limited by $(C_{max}-C_{min})/2$ (i.e., an incremental change in the total effective capacitance of the varactor array 110). Theoretically, one can use very small varactors to make the incremental change $(C_{max}-C_{min})/2$ very small and thus achieve a high resolution. In practice, however, a manufacturing process will always impose a constraint on minimum dimensions allowed for a device. For a typical CMOS process as of nowadays technology, for instance, an incremental capacitance change for a varactor array can be in the order of magnitude of femto-Farads (fF or $10^{-15}$ F). In many applications, a corresponding resolution in frequency tuning is not very high. What is needed is a method of extending a frequency tuning of a DCO.

SUMMARY OF THE INVENTION

The present invention solves these and other problems by providing a method and an apparatus for a digitally controlled oscillator (DCO) with high resolution in frequency tuning. The DCO receives a first digital control word comprising a plurality of bits and generates an oscillating signal of an oscillation frequency at a first output node in response to the first digital control word. In one embodiment, the DCO comprises a first digitally controlled capacitive network that includes a capacitive circuit of a tunable capacitance, a first capacitor of a first capacitance and a second capacitor of a second capacitance. The capacitive circuit is controlled by the first digital control word and the tunable capacitance is tunable between a lower bound and an upper bound. The first capacitor has a first terminal coupled to the capacitive circuit at a first internal circuit node. The second capacitor is coupled between the first internal circuit node and the first output node. In one application, the first capacitance is substantially greater (e.g., at least ten times greater) than the upper bound of the tunable capacitance while the second capacitance is substantially smaller than (e.g., no more than one-tenth of) the first capacitance.

For example, the tunable capacitance of the capacitive circuit has a tunable step size corresponding to an incremental change in the first digital control word and a lower limit of the tunable step size may be constraint by minimum device dimensions imposed by a particular manufacturing process. The first capacitance of the first capacitor combines with the tunable capacitance in an electrically parallel configuration, and the second capacitance of the second capacitor combines with the first capacitance and the tunable capacitance in an electrically serial configuration to generate a first effective capacitance provided by the first digitally controlled capacitive network at the first output node. The first effective capacitance has an effective step size corresponding to the incremental change in the first digital control word. The effective step size can smaller than (or a fraction of) the tunable step size by selecting the first capacitance to be greater than the upper bound of the tunable capacitance and the second capacitance to be smaller than the first capacitance. The frequency tuning resolution of the DCO increases as the effective step size of the first effective capacitance decreases.

In one embodiment, the capacitive circuit comprises a plurality of varactors with each of the varactors having a first terminal coupled to the first internal circuit node and a second terminal coupled to a respective bit of the first digital control word. The tunable step size is limited in part by the values (or dimensions) of the respective varactors (e.g., smaller varactors provide a smaller tunable step size). A resistor can be coupled between the first internal circuit node and a first substantially fixed-potential node to establish a biasing condition (e.g., a biasing voltage at the first terminals) for the plurality of varactors. In one application, the first capacitor has a second terminal coupled to a second substantially fixed-potential node and the first digitally controlled capacitive network provides the first effective capacitance in a single-ended configuration at the first output node.

In another embodiment, the capacitive circuit comprises a plurality of sub-circuits (e.g., varactor pairs) coupled in parallel between the first internal circuit node and a second internal circuit node. Each of the sub-circuits is controlled by a respective bit of the first digital control word. In one implementation, each sub-circuit comprises a first varactor and a second varactor. The first varactor has a first terminal coupled to the first internal circuit node and a second terminal coupled to the respective bit of the first digital control word. The second varactor has a first terminal coupled to the second internal circuit node and a second terminal coupled to the respective bit of the first digital control word. To establish a biasing condition (e.g., biasing voltages) for the capacitive circuit (i.e., the first and second varactors), a first resistor is coupled between the first terminals of the first varactors (or the first internal circuit node) and a first substantially fixed-potential node while a second resistor is coupled between the first terminals of the second varactors (or the second internal circuit node) and a second substantially fixed-potential node. The first substantially fixed-potential node and the second substantially fixed-potential node can have the same electrical potential.

In one application, the first digitally controlled capacitive network further comprises a third capacitor of a third capacitance. The first capacitor is coupled to the second internal circuit node while the third capacitor is coupled between the second internal circuit node and a second output node. The first digitally controlled capacitive network provides the first effective capacitance in a differential configuration across the first and the second output nodes. The first effective capacitance is substantially equal to a serial combination of the third capacitor, the second capacitor and a parallel combination of the capacitive circuit and the first capacitor. In one embodiment, the third capacitance is approximately equal to the second capacitance and the first capacitance is at least ten times greater the second capacitance such that the effective step size of the first effective capacitance is smaller than the tunable step size of the capacitive circuit.

In one embodiment, the varactors used in the capacitive circuit are substantially identical to each other. For example, substantially identical varactors have substantially similar low capacitance values in response to a first logic level of a digital bit of an input control word and substantially similar high capacitance values in response to a second logic level of the digital bit. A capacitive circuit implemented with substantially identical varactors can have substantially similar incremental changes (or uniform step sizes) in an output capacitance (or tunable capacitance) in response to each incremental change in the input control word (or over an entire range of the input control word). However, the first effective capacitance of the first digitally controlled capacitive network may not have uniform step sizes over the entire range of the input control word in this case.

In another embodiment, the varactors in the capacitive circuit are respectively weighted such that each incremental change in the first digital control word leads a substantially similar incremental change in the first effective capacitance of the first digitally controlled capacitive network. For example, the varactors are differently weighted (or differently sized) such that two or more the varactors in the capacitive circuit have different capacitance values in response to first logic levels or second logic levels of the respective digital bits. The output capacitance of the capacitive circuit may not have uniform steps sizes over the entire range of the first digital control word, but the varactors can be weighted such that the first effective capacitance of the first digitally controlled capacitive network has uniform step sizes across the entire range of the first digital control word.

In one embodiment, the DCO further comprises a pair of cross-coupled transistors, a fourth capacitor, a first inductor, and a second inductor. The pair of cross-coupled transistors is coupled between the first output node and the second output node. The fourth capacitor is also coupled between the first output node and the second output node. The first inductor is coupled between the first output node and a third substantially fixed-potential node. The second inductor is coupled between the second output node and the third substantially fixed-potential node.

In some implementations, the DCO further comprises a second digitally controlled capacitive network coupled between the first output node and the second output node. The second digitally controlled capacitive network establishes a second effective capacitance in response to a second digital control word. An incremental change in the second effective capacitance in response to an incremental change in the second digital control word can be different from an incremental change in the first effective capacitance of the first digitally controlled capacitance network in response to an incremental change in the first digital control word. That is, the second digital control word provides additional control of the oscillation frequency of the DCO. Furthermore, the second effective capacitance can have a different step size than the effective step size of the first effective capacitance to provide control of the oscillation frequency at a different resolution. For example, one digital control word can be used for coarse frequency tuning while another digital control word is used for fine frequency tuning.

In one embodiment, the first digitally controlled capacitive network is used to control an oscillation frequency of a DCO implemented in a ring oscillator configuration. The ring oscillator comprises a plurality of gain stages coupled in a closed loop. Each of the gain stages has a differential input and a differential output. The differential output of one gain stage is coupled to the differential input of another gain stage in reverse polarity. The first digitally controlled capacitive network is coupled across one of the differential outputs to introduce a delay and thereby adjust the oscillation frequency. An additional digitally controlled capacitive network can be coupled in parallel with the first digitally controlled capacitive network or coupled to the differential output of another gain stage to provide additional control of the oscillation frequency. In some applications, the additional digitally controlled capacitive network and the first digitally controlled capacitive network are controlled by different digital control words or generate respective effective capacitances with different step sizes to facilitate frequency tuning at different resolutions.

In one embodiment, a method for implementing a DCO comprises using an oscillator topology comprising a capacitive network, wherein an oscillation frequency of the DCO is determined at least in part by an effective capacitance of the capacitive network. In one implementation, an N-bit digital control signal is used to control a first variable capacitive circuit having a first variable capacitance, wherein N is an integer greater than one. A second capacitor is electrically coupled in parallel with the first variable capacitive circuit to form a second variable capacitive circuit having a second variable capacitance. A third capacitor is electrically coupled in series with the second variable capacitive circuit to form a third variable capacitive circuit having a third variable capacitance.

As discussed in further detailed below, the capacitive network of the DCO comprises the third variable capacitive circuit and can be configured to provide high resolution in frequency tuning of the DCO. For example, the first variable capacitance of the first variable capacitive circuit has a first step size in response to an incremental change in the digital control signal. The second capacitor and the third capacitor can be sized such that the effective capacitance of the capacitive network has a second step size that is a fraction of the first step size. In one implementation, the second capacitance has a greater value than a maximum value of the first variable capacitance and the third capacitance is less than the second capacitance. The effective capacitance of the capacitive network varies with the digital control signal to define a frequency tuning range for the DCO while the second step size determines the frequency tuning resolution.

In one embodiment, the first variable capacitive circuit comprises an electrically parallel combination of N variable capacitive sub-circuits. Each of the variable capacitive sub-circuits asserts either a maximum capacitance value or a minimum capacitance value in response to a state of a respective bit of the N-bit digital control signal. In one implementation, each of the variable capacitive sub-circuits comprises two varactors electrically coupled in series and controlled at a common node by a common respective bit of the N-bit digital control signal. In some applications, a fourth capacitor is coupled in parallel with the third variable capacitive circuit to form the capacitive network. The fourth capacitor may be used to adjust the minimum (or offset) operating frequency for the DCO.

In another embodiment, a method for frequency tuning with increased resolution in a DCO comprises generating a first tuning (or variable) capacitance based on a first digital control word, generating a second tuning capacitance based on a second digital control word, and combining the first tuning capacitance and the second tuning capacitance in an electrically parallel configuration to generate a total effective capacitance for controlling a frequency of the DCO. For example, the first digital control word controls a first varactor array to generate a first variable capacitance with a first step size corresponding to an incremental change in the first digital control word. The first varactor array is arranged in an electrically parallel configuration with a first capacitor. A combination of the first varactor array and the first capacitor is arranged in an electrically serial configuration with a second capacitor to generate the first tuning capacitance with a second step size. In some implementations, the second step size is a fraction of the first step size.

The second digital control word controls a second varactor array to generate a second variable capacitance with a third step size corresponding to an incremental change in the second digital control word. The second varactor array is arranged in an electrically parallel configuration with a third capacitor. A combination of the second varactor array and the third capacitor is arranged in an electrically serial configuration with a fourth capacitor to generate the second tuning capacitance with a fourth step size that is a fraction of the third step size. The fourth step size is smaller than the second step size such that varying the first digital control word provides coarse frequency tuning and varying the second digital control word provides fine frequency tuning of the DCO.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE INVENTION

The present invention relates to a digitally controlled oscillator (DCO) and in particular to a DCO having a high resolution in frequency tuning. While the specification describes several example embodiments of the invention, it should be understood that the invention can be implemented in many way and is not limited to the particular examples described below or to the particular manner in which any features of such examples are implemented.

Figure 1A:
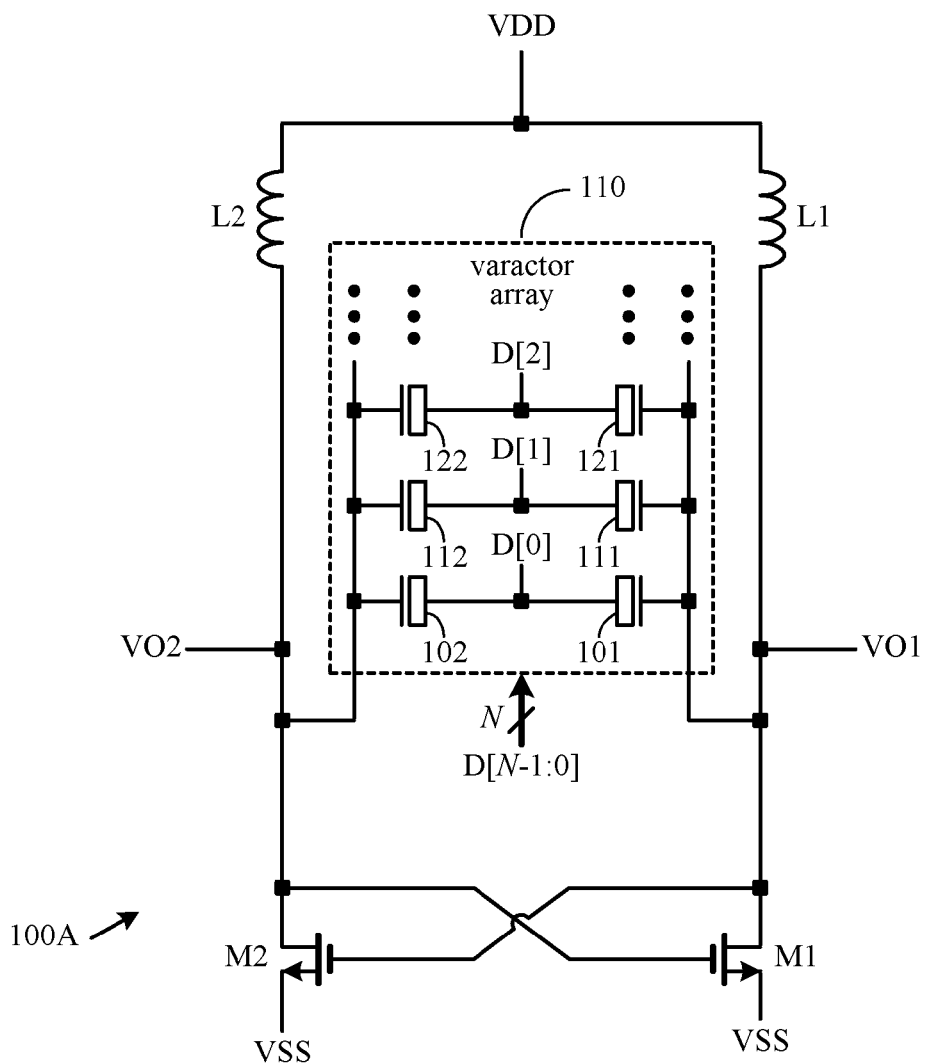
FIG. 1A shows a digitally controlled oscillator according to the prior art.
Figure 1B:
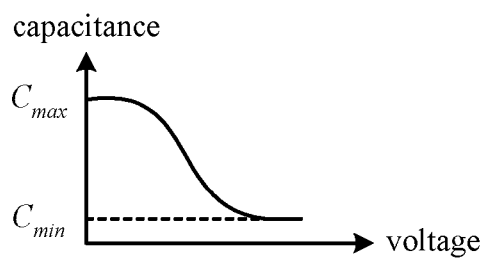
FIG. 1B shows a typical transfer characteristic of a varactor.
Figure 1C:
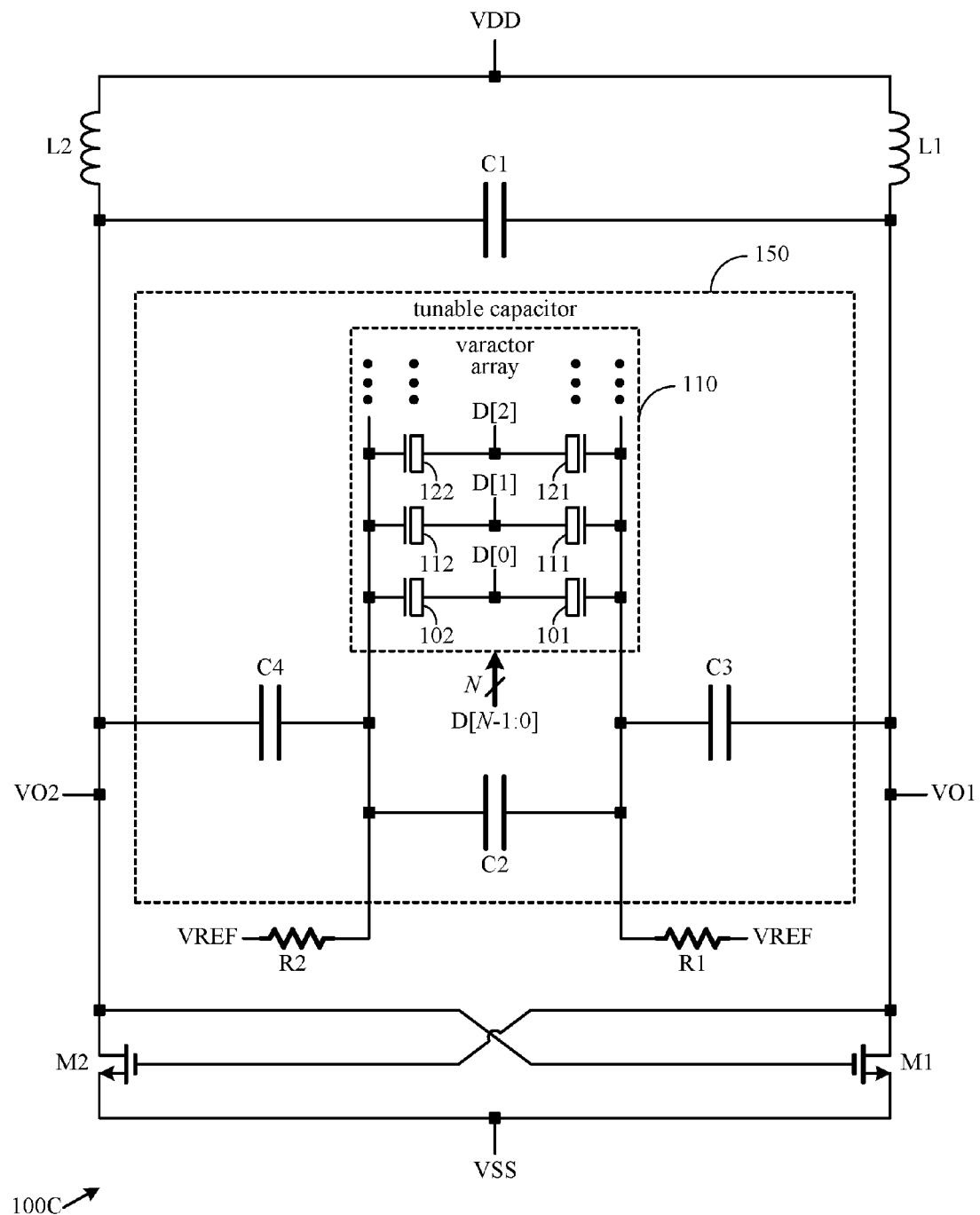
FIG. 1C shows one embodiment of a digitally controlled oscillator in accordance with the present invention.

FIG. 1C shows one embodiment of a DCO 100C in accordance with the present invention. The DCO 100C illustrated in FIG. 1C is one example of an oscillator topology comprising a capacitive network (or digitally controlled capacitive network) 150. The oscillation frequency of the DCO 100C is determined at least in part by an effective capacitance of the capacitive network 150. The DCO 100C receives an N-bit digital control word (or N-bit digital control signal) comprising a plurality of bits (e.g., D[N−1:0] with N being an integer greater than one) and generates an oscillating signal of an oscillation frequency at an output (e.g., across differential output nodes VO1 and VO2) in response to the N-bit digital control word.

In one embodiment, the capacitive network 150 includes a capacitive circuit 110 controlled by the N-bit digital control word. The capacitive circuit 110 has a tunable capacitance (or a first variable capacitance) that can be tuned between a lower bound and an upper bound. The capacitive network 150 further includes a first capacitor C2 and a second capacitor C4. The first capacitor C2 is electrically coupled in parallel with the capacitive circuit 110 to form a first capacitive sub-circuit having a second variable capacitance. The second capacitor C4 is electrically coupled in series with the capacitive first sub-circuit to form a second capacitive sub-circuit having a third variable capacitance. The first variable capacitance, the second variable capacitance and the third variable capacitance can have different respective ranges of capacitance values and different respective step sizes in response to incremental changes in the N-bit digital control word.

In FIG. 1C, the first capacitor C2 has a first terminal coupled to one end of the capacitive circuit 110 at a first internal circuit node and a second terminal coupled to another end of the capacitive circuit 110 at a second internal circuit node. The second capacitor C4 is coupled between the first internal circuit node and the first output node VO2. The capacitive network 150 further includes a third capacitor C3 coupled between the second internal circuit node and the second output node VO1. In one embodiment, the first capacitor C2 has a first fixed capacitance value while the second capacitor C4 and the third capacitor C3 have substantially similar second fixed capacitance values. In some implementations, the first fixed capacitance value is substantially greater than (e.g., at least ten times of) the upper bound of the first variable capacitance associated with the capacitive circuit 110 and substantially greater than (e.g., at least 10 times) the second fixed capacitance value to provide high resolution in frequency tuning of the DCO 100C.

In other words, the capacitive network 150 provides an effective capacitance across the differential output nodes VO1 and VO2 with a step size that is much smaller than the step size of the tunable capacitance provided by the capacitive circuit 110 when the second capacitor C4 and the third capacitor C3 have substantially smaller capacitance values than the capacitance value of the first capacitor C2 while the first capacitor C2 has a capacitance value that is substantially greater than a maximum value of tunable capacitance of the capacitive circuit 110. In FIG. 1C, the DCO 100C further includes a fourth capacitor C1 coupled across the output nodes VO1 and VO2. The fourth capacitor C1 can optionally be considered as part of the capacitive network 150 and can be used to modify a range of capacitance values for the capacitive network 150 without affecting the step size of capacitive network 150.

In one embodiment, the capacitive circuit (e.g., a varactor array) 110 includes a plurality of varactor sub-circuits electrically coupled in parallel between the first internal circuit node and the second internal circuit node. Each of the varactor sub-circuits (e.g., varactor pairs) is controlled by a respective bit of the N-bit digital control word and includes a first varactor (or first variable capacitor) and a second varactor (or second variable capacitor). The first varactors (shown as first varactors 102, 112, 122 . . . ) have first terminals coupled to the first internal circuit node and respective second terminals coupled to the respective bits of the N-bit digital control word. The second varactors (shown as second varactors 101, 111, 121 . . . ) have first terminals coupled to the second internal circuit node and respective second terminals coupled to the respective bits of the N-bit digital control word.

That is, the varactor array 110 comprises an electrically parallel combination of N varactor pairs. Each of the varactor pairs includes two varactors electrically coupled in series and controlled at a common node by a common respective bit of the N-bit digital control word. Each of the varactor pairs asserts either a high capacitance value or a low capacitance value in response to a state (e.g., logic low or logic high) of a respective bit of the N-bit digital control word. In one embodiment, the varactor array 110 comprises a plurality of substantially similar varactors and has a tunable capacitance $C_{tune}$ that is tunable (or variable) between $N \cdot C_{min}/2$ and $N \cdot C_{max}/2$, inclusively, with a step size of $(C_{max}-C_{min})/2$. The terms $C_{min}$ and $C_{max}$ respectively denote a first (or minimum) capacitance value and a second (or maximum) capacitance value generated by each varactor (or constituent varactor) in response to a first control voltage (e.g., logic high of a digital bit) and a second control voltage (e.g., logic low of a digital bit). Thus, each of the varactor pairs has a low capacitance value of $C_{min}/2$ and a high capacitance value of $C_{max}/2$.

In FIG. 1C, a biasing condition for the varactor array 110 is established through a first resistor R2 and a second resistor R1. Each of the varactors in the varactor array 110 has one end (e.g., the first terminal) coupled to either the first resistor R2 or the second resistor R1 to establish the biasing condition. For example, the first resistor R2 is coupled between the first terminals of the first varactors (or the first internal circuit node) and a first substantially fixed-potential node. The second resistor R1 is coupled between the first terminals of the second varactors (or the second internal circuit node) and a second substantially fixed-potential node. The first and second substantially fixed-potential nodes can have the same electrical (or voltage) potential (VREF) and can have the same electrical potential as other substantially fixed-potential nodes (e.g., VDD) in the DCO 100C. The resistance values of the first resistor R2 and the second resistor R1 are very large such that their respective impedances are substantially greater (e.g., at least 20 times greater) than impedances of the capacitors (e.g., C2, C3, C4 and the varactor array 110) in the capacitive network 150 in frequencies of interest (or a range of operating frequencies). In this manner, the first resistor R2 and the second resistor R1 establish the bias condition for the varactors without introducing a significant load to the capacitive network 150.

In one embodiment, the DCO 100C further comprises a pair of cross-coupled transistors M1, M2 coupled between the first output node and the second output node, a first inductor L2 coupled between the first output node and a third substantially fixed-potential node (VDD) and a second inductor L1 coupled between the second output node and the third substantially fixed-potential node. In one implementation, the cross-coupled transistors are NMOS transistors with source terminals commonly coupled to a fourth substantially fixed-potential node (VSS). The first transistor M2 has a drain terminal coupled to the first output node and a gate terminal coupled to the second output node. The second transistor M1 has a drain terminal coupled to the second output node and a gate terminal coupled to the first output node. As connected, the pair of cross-coupled transistors M1, M2 provides a positive feedback loop between the first output node and the second output node. The pair of inductors L1, L2 provides an inductive load to the transistors M1, M2.

The oscillating frequency of the DCO 100C in FIG. 1C is approximately $1/2\pi\sqrt{2LC_{total}}$, where $C_{total}$ denotes a total effective capacitance across the output nodes VO1 and VO2. Assuming that the second capacitor C4 and the third capacitor C3 have substantially similar capacitance values $C_3$, the total effective capacitance has the following relationship: $C_{total}=C_1+(C_3/2)(C_2+C_{tune})/(C_3/2+C_2+C_{tune})$. In one embodiment, the first capacitance $C_2$ of the first capacitor C2 in the capacitive network 150 is substantially greater than (e.g., at least ten times greater than) the second capacitance $C_3$ of the second capacitor C4 or the third capacitor C3. By way of example but not limitation, $C_2$ can also be substantially greater than the tunable capacitance $C_{tune}$ of the capacitive circuit 110 to facilitate the following approximations:

$$C_{total} = C_1 + (C_3/2)/(1 + (C_3/2)/(C_2 + C_{tune}))$$
$$\approx C_1 + (C_3/2)(1 - (C_3/2)/(C_2 + C_{tune}))$$
$$= C_1 + (C_3/2)(1 - (C_3/2C_2)/(1 + C_{tune}/C_2))$$
$$\approx C_1 + (C_3/2)(1 - (C_3/2C_2)(1 - C_{tune}/C_2))$$
$$= C_1 + C_3/2 - (C_3/2C_2)^2 C_2 + (C_3/2C_2)^2 C_{tune}$$

Base on the above approximations, an incremental change in the total effective capacitance $C_{total}$ in response to an incremental change in the digital control word is determined by the term $(C_3/2C_2)^2 C_{tune}$. That is, the incremental change in the total effective capacitance is approximately equal to the incremental change of $C_{tune}$ multiplied by $(C_3/2C_2)^2$ or approximately equal to $(C_3/2C_2)^2(C_{max}-C_{min})/2$. Since $C_2$ is substantially greater than $C_3$, the incremental change in the total effective capacitance $C_{total}$ is very small or at least smaller than the incremental changes in the tunable capacitance of the varactor array 110. The incremental changes in the tunable capacitance of the varactor array 110 are limited in part by minimum device dimensions of a manufacturing process. The ability to have smaller incremental changes in the total effective capacitance of the DCO 100C allows the DCO 100C to be tuned with a higher degree of frequency resolution despite a constraint on the minimum device dimensions dictated by a particular manufacturing process.

The above approximations assume that the constituent varactors in the varactor array 110 are substantially identical in terms of their capacitance-voltage characteristics (e.g., equally weighted). Under this assumption, the incremental changes for the tunable capacitance of the varactor array 110 are substantially uniform across an entire range of the digital control word and are approximately equal to $(C_{max}-C_{min})/2$. That is, each incremental change in the digital control word leads to a substantially similar incremental change in the tunable capacitance of the varactor array 110. However, incremental changes in the total effective capacitance of the capacitive network 150 may not be uniform across the entire range of the digital control word when the varactors are substantially identical.

In other embodiments, the constituent varactors in the varactor array 110 are intentionally designed to be different (or differently weighted). Under this circumstance, the tunable capacitance of the varactor array 110 has different incremental changes across the entire range of the digital control word. However, the constituent varactors can be weighted such that the total effective capacitance of the capacitive network 150 has uniform incremental changes over the entire range of the digital control word. That is, each incremental change in the digital control word leads to a substantially similar incremental change in the total effective capacitance provided by the capacitive network 150. The oscillation frequency of the DCO 100C is controlled by the total effective capacitance, and uniform incremental changes in the total effective capacitance means the oscillation frequency can advantageously be adjusted in uniform steps across the entire range of the digital control word.

The principle of the present invention can be practiced in many alternative embodiments without departing from the scope of the present invention. For example, many modifications can be made to the DCO 100C shown in FIG. 1C without departing from the scope of the present invention. Such modifications include connecting the source terminals of the transistors M1 and M2 to a current source instead of the fourth substantially fixed-potential node (VSS), using a PMOS cross-coupled transistor pair instead of the NMOS cross-coupled transistor pair M1 and M2, or using a combination of both the PMOS cross-coupled transistor pair and the NMOS cross-coupled transistor pair M1 and M2 to enhance an oscillation gain. The roles of the third and the fourth substantially fixed-potential nodes are reversed for the PMOS cross-coupled transistor pair in comparison to the NMOS cross-coupled transistor pair. That is, the PMOS cross-coupled transistor pair has source terminals coupled to the third substantially fixed-potential node (VDD), and the inductors L1 and L2 would be coupled between respective drain terminals of the PMOS cross-coupled transistor pair and the fourth substantially fixed-potential node (VSS). The drain terminals of the PMOS cross-coupled transistor pair become the output nodes, and the capacitive network 150 and the fourth capacitor C1 would be coupled between the drain terminals of the PMOS cross-coupled transistor pair.

Figure 1D:
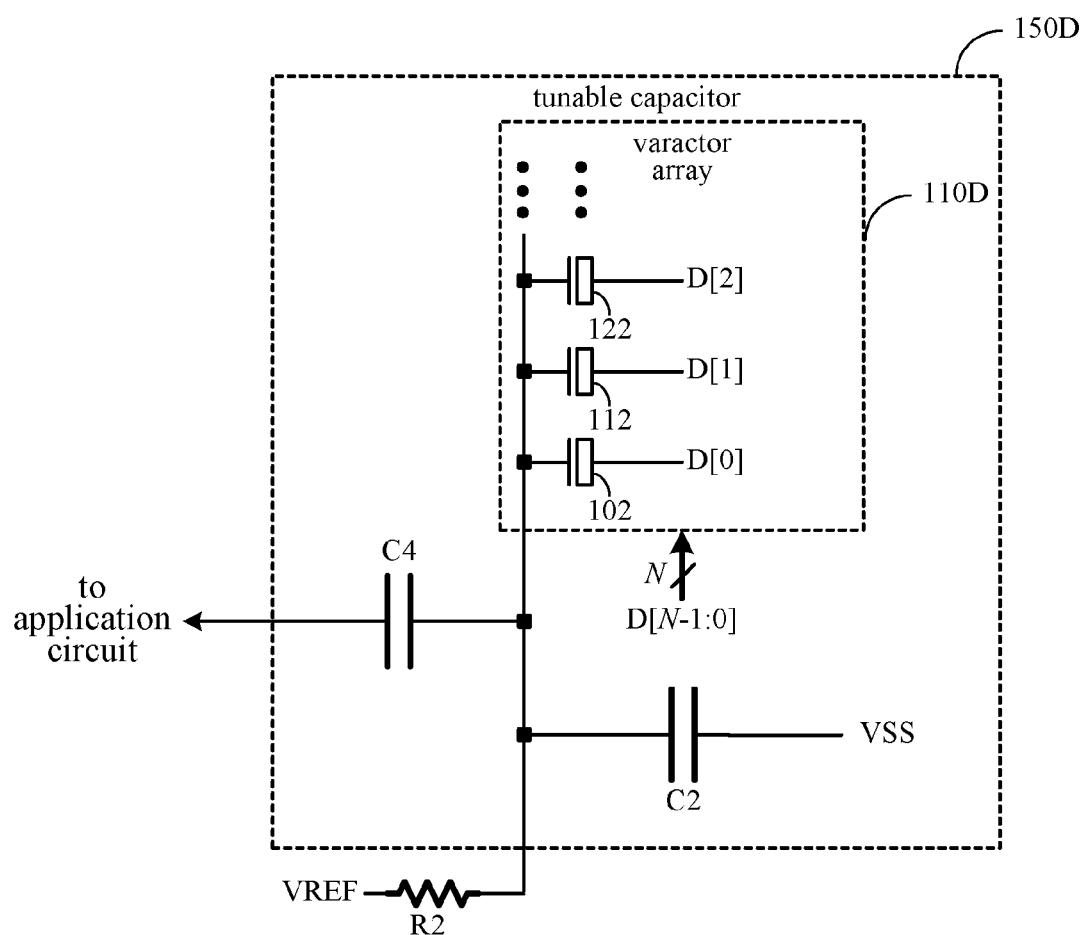
FIG. 1D shows one embodiment of a single-ended tunable capacitor in accordance with the present invention.

Furthermore, FIG. 1C shows one topology (e.g., a differential circuit topology) of an LC oscillator. There are numerous alternative differential and single-end circuit topologies for implementing an LC oscillator that can use the capacitive network 150 to provide a variable capacitance having the advantages described above (e.g., a high frequency resolution). By way of example, FIG. 1D shows one embodiment of a single-ended tunable capacitive network 150D configured for an LC oscillator implemented in a single-ended circuit topology.

The single-ended tunable capacitive network 150D comprises a capacitive circuit 110D, a first capacitor C2 and a second capacitor C4. In one embodiment, the capacitive circuit 110D is a varactor array comprising a plurality of varactors (e.g., varactors 102, 112, 122 . . . ) controlled by respective bits (e.g., D[0], D[1], D[2] . . . ) of a digital control word D[N−1:0]. Each of the varactors has a first terminal coupled to an internal circuit node and a second terminal coupled to the respective bit of the digital control word. A resistor R2 is coupled between a substantially fixed-potential node (VREF) and the first terminals (or the internal circuit node) to bias the plurality of varactors. The first capacitor C2 is coupled between the internal circuit node and another substantially fixed-potential node (VSS). The second capacitor C4 is coupled between the internal circuit node and an output node of the single-ended tunable capacitive network 150D. As described above, the varactors can be equally weighted or differently weighted.

Figure 1E:
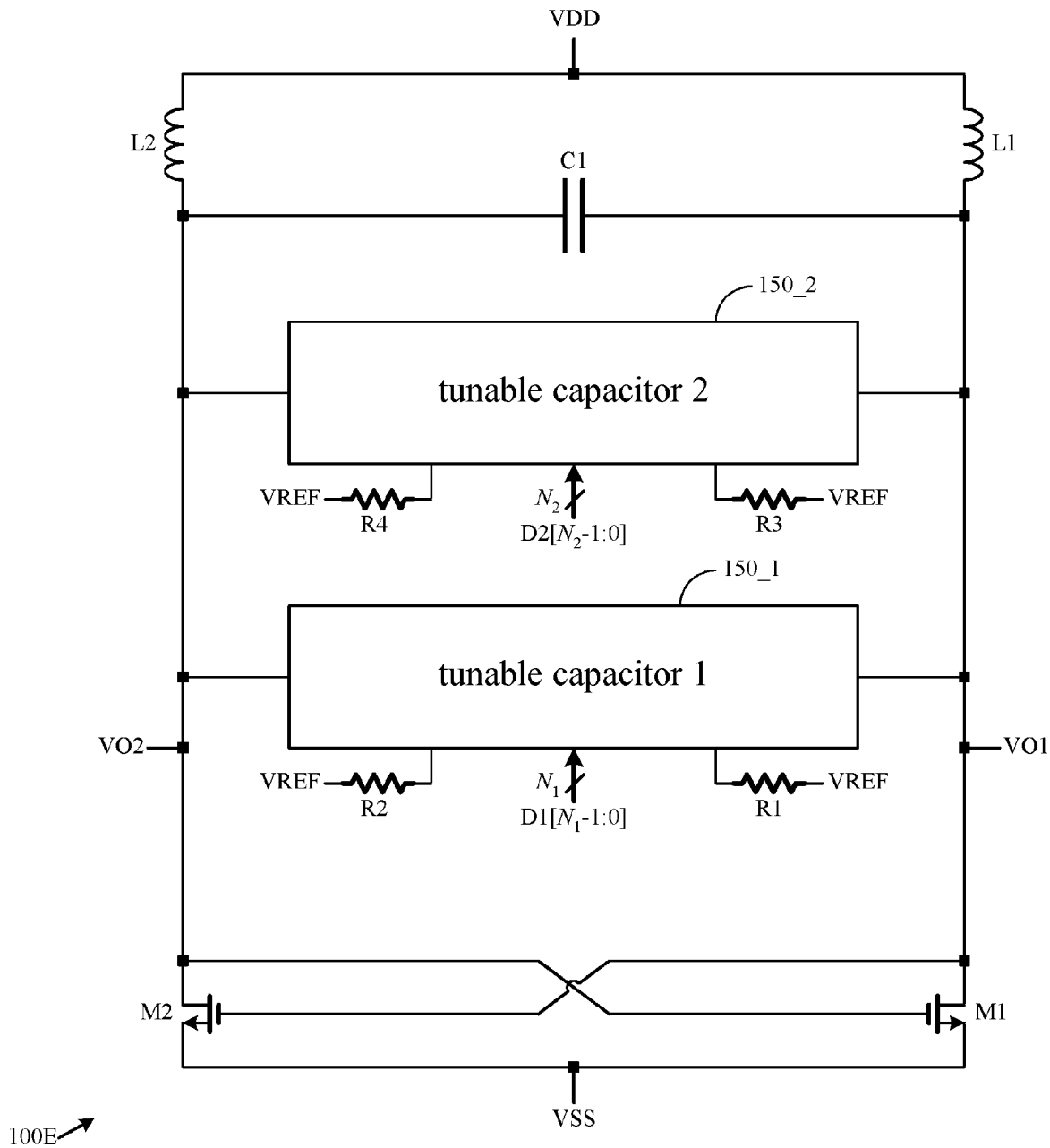
FIG. 1E show another embodiment of a digitally controlled oscillator in accordance with the present invention.

In other topologies, an LC oscillator can include two or more tunable capacitive networks to control an oscillation frequency. FIG. 1E shows one embodiment of a DCO 100E with two separately tunable capacitive networks 150_1 and 150_2. By way of example, the DCO 100E shown in FIG. 1E is substantially similar to the DCO 100C shown in FIG. 1C except the capacitive network 150 of FIG. 1C is replaced with the separately tunable capacitive networks 150_1 and 150_2 in FIG. 1E. In one embodiment, each of the tunable capacitive networks 150_1 and 150_2 has a similar circuit topology as the capacitive network 150. In another embodiment, one of the tunable capacitive networks 150_1 and 150_2 has a similar circuit topology as the capacitive network 150 while the other tunable capacitive network has a different circuit topology.

In FIG. 1E, the separately tunable capacitive networks 150_1 and 150_2 are electrically coupled in parallel across differential output nodes VO1 and VO2. The first tunable capacitive network 150_1 receives a first digital control word D1[$N_1$−1:0] to generate a first effective capacitance and the second tunable capacitive network 150_2 receives a second digital control word D2[$N_2$−1:0] to generate a second effective capacitance. The first digital word and the second digital word can have different numbers (or alternatively identical numbers) of digital bits. The first effective capacitance and the second effective capacitance combine (e.g., add) to generate a total effective capacitance across the differential output nodes VO1 and VO2.

In one embodiment, the first effective capacitance and the second effective capacitance have different step sizes in response to incremental changes in the respective first and second digital control words. That is, an incremental change in the first effective capacitance in response to an incremental change in the first digital control word is different from an incremental change in the second effective capacitance in response to the second digital control word. For example, in the case that both of the tunable capacitive networks 150_1 and 150_2 use a similar circuit topology as the capacitive network 150, the tunable capacitive networks 150_1 and 150_2 can have different capacitance values for their respective internal capacitors (e.g., C2, C3, C4 and varactors). In one application, one of the tunable capacitive networks 150_1 and 150_2 provides coarse frequency tuning (e.g., using an effective capacitance with a larger step size) while the other tunable capacitive network provides fine frequency tuning (e.g., using an effective capacitance with a smaller step size) for the DCO 100E.

Figure 1F:
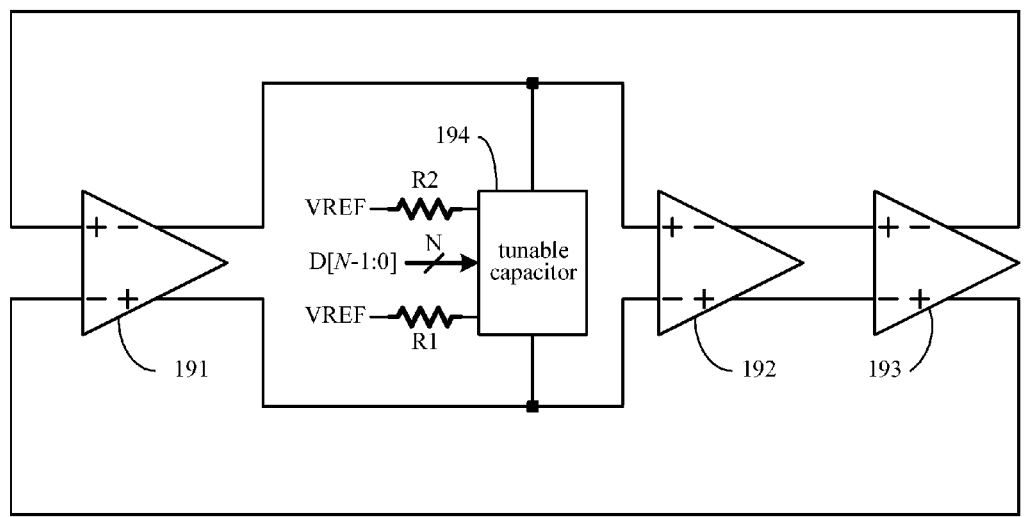
FIG. 1F shows one embodiment of a digitally controlled ring oscillator in accordance with the present invention.

In addition to LC oscillators, a digitally controlled tunable capacitive network capable of relatively small step sizes (e.g., the differential capacitive network 150 shown in FIG. 1C or the singled-ended capacitive network 150D shown in FIG. 1D) is useful in many other types of oscillator circuits to provide high frequency resolution. FIG. 1F shows another type of a DCO 100F that uses one or more tunable capacitive networks to control an oscillation frequency. In particular, the DCO 100F shown in FIG. 1F is a digitally controlled ring oscillator with three gain stages 191, 192, and 193. The three gain stages 191, 192, and 193 are coupled in a closed loop (or ring). By way of example, a tunable capacitive network 194 is inserted between the first gain stage 191 and the second gain stage 192.

In one embodiment, the gain stages 191, 192, and 193 have differential inputs and differential outputs. The tunable capacitive network 194 has a similar circuit topology as the differential capacitive network 150 shown in FIG. 1C and is coupled across the differential output of the first gain stage 191. The tunable capacitive network 194 receives a digital control word D[N−1:0] to generate a variable capacitance at an output in accordance with a value of the digital control word. The variable capacitance generated by the tunable capacitive network 194 introduces a delay to an output of the first gain stage 191. The oscillation frequency of the DCO 100F can be altered (or varied) by varying the delay (e.g., by changing the variable capacitance's value). Since the tunable capacitive network 194 can be configured to adjust the variable capacitance with a relatively high degree of resolution (e.g., through small incremental steps in response to incremental changes in the digital control word), the oscillation frequency of the DCO 100F can be tuned with relatively high resolution.

In other embodiments, the DCO 100F has additional gain stages and/or additional tunable capacitive networks not shown in FIG. 1F. For example, an additional tunable capacitive network can be coupled in parallel with the tunable capacitive network 194 to provide an additional variable capacitance. The additional variable capacitance is controlled by a different digital control word and can have a different step size to provide a different frequency tuning resolution. In alternate embodiments, one or more additional tunable capacitive networks are coupled across the differential outputs of the other gain stages 192, 193 or additional gain stages.

While certain embodiments of the inventions have been described, these embodiments have been presented by way of example only, and are not intended to limit the scope of the inventions. Indeed, the novel methods and devices described herein may be embodied in a variety of other forms; furthermore, various omissions, substitutions, and changes in the form of the methods and devices described herein may be made without departing from the spirit of the inventions. The accompanying claims and their equivalents are intended to cover such forms or modifications as would fall within the scope and spirit of the inventions.

What is claimed is:

1. A digitally controlled oscillator for generating an oscillating signal of an oscillation frequency at a first output node, the digitally controlled oscillator comprising:
    a first tunable capacitance comprising a plurality of non-equally weighted switchable capacitive elements, the first tunable capacitance being configured to be controlled by a first digital control word, wherein the first digital control word controls the first tunable capacitance with non-uniform steps corresponding to incremental changes in the first digital control word; and
    a network of one or more fixed value capacitances coupled to the first tunable capacitance, wherein the combination of the first tunable capacitance and the network of one or more fixed value capacitances comprises a second tunable capacitance, and wherein the second tunable capacitance has substantially uniform steps corresponding to the incremental changes in the first digital control word.

2. The digitally controlled oscillator of claim 1, wherein the substantially uniform steps of the second tunable capacitance are smaller than the non-uniform steps of the first tunable capacitance.

3. The digitally controlled oscillator of claim 2, wherein the network of one or more fixed value capacitances comprises a first fixed value capacitor of a first capacitance coupled in parallel with the first tunable capacitance.

4. The digitally controlled oscillator of claim 3, wherein the network of one or more fixed value capacitances further comprises a second fixed value capacitor of a second capacitance coupled in series with the parallel combination of the first fixed value capacitor and the first tunable capacitance.

5. The digitally controlled oscillator of claim 4, wherein the first capacitance is substantially greater than the upper bound of the first tunable capacitance, and the second capacitance is substantially smaller than the first capacitance.

6. The digitally controlled oscillator of claim 1 further comprising:
    a third tunable capacitance comprising a plurality of switchable capacitive elements, the third tunable capacitance being configured to be controlled by a second digital control word, wherein the second digital control word controls the third tunable capacitance with steps, corresponding to incremental changes in the second digital control word, that are greater than the steps of the second tunable capacitance in order to provide coarse frequency tuning.

* * * * *